(12) United States Patent
Piispanen

(10) Patent No.: US 11,199,367 B2
(45) Date of Patent: Dec. 14, 2021

(54) METHOD AND SYSTEM FOR CONTROLLING ENERGY STREAMS

(71) Applicants: Jero Ahola, Lappeenranta (FI); Ari Piispanen, Lappeenranta (FI)

(72) Inventor: Ari Piispanen, Lappeenranta (FI)

(*) Notice: Subject to any disclaimer, the term of this patent is extended or adjusted under 35 U.S.C. 154(b) by 170 days.

(21) Appl. No.: 16/488,856

(22) PCT Filed: Feb. 26, 2018

(86) PCT No.: PCT/FI2018/050136
§ 371 (c)(1),
(2) Date: Aug. 26, 2019

(87) PCT Pub. No.: WO2018/154186
PCT Pub. Date: Aug. 30, 2018

(65) Prior Publication Data
US 2020/0011613 A1    Jan. 9, 2020

(30) Foreign Application Priority Data
Feb. 27, 2017 (FI) ..................... 20175180

(51) Int. Cl.
*F28D 20/02* (2006.01)
*H02J 3/00* (2006.01)
(Continued)

(52) U.S. Cl.
CPC ............ *F28D 20/021* (2013.01); *F01K 3/186* (2013.01); *G05B 15/02* (2013.01); *H02J 3/00* (2013.01); *H05K 7/20* (2013.01)

(58) Field of Classification Search
CPC .. F28D 20/021; F28D 20/028; F28D 21/0001; F01K 3/186; G05B 15/02;
(Continued)

(56) References Cited

U.S. PATENT DOCUMENTS 6,014,017 A    1/2000  Weinhold et al.
8,931,277 B2 * 1/2015  Peterson ............... F28D 20/021
                                                      60/651
(Continued)

FOREIGN PATENT DOCUMENTS

CN    102777874 A    11/2012
CN    202759240 U    2/2013
(Continued)

OTHER PUBLICATIONS

Extended European Search Report for EP Application No. 18757951. 1, dated Aug. 10, 2020, 8 pages.
(Continued)

*Primary Examiner* — Charles R Kasenge
(74) *Attorney, Agent, or Firm* — Fay Sharpe LLP

(57) ABSTRACT

The invention relates to a method and to a corresponding system for controlling energy streams in order to connect operations of an electricity distribution network (1) and a heat distribution network (2) by means of an intermediate energy storage unit (3). According to the invention, the power balance and quality of current and voltage of the electricity distribution network (1) are adjusted by supplying the losses provided by adjustment of the electricity distribution network to the energy storage unit (3) in the form of heat, and from the energy storage unit the heat is extracted to the heat distribution network (2) according to the heat requirement of the heat distribution network.

15 Claims, 2 Drawing Sheets

(51) Int. Cl.
*H05K 7/20* (2006.01)
*G05B 15/02* (2006.01)
*F01K 3/18* (2006.01)

(58) Field of Classification Search
CPC ..... H05K 7/20; Y02B 70/3225; Y04S 20/222; Y02E 60/14; H02J 3/1842; H02J 3/01; H02J 3/12; H02J 3/00; H02J 3/28; H02J 3/14; H02J 2310/12
See application file for complete search history.

(56) References Cited

U.S. PATENT DOCUMENTS

| | | | |
|---|---|---|---|
| 9,534,508 B2* | 1/2017 | Brunhuber | F22B 1/28 |
| 9,677,809 B1* | 6/2017 | Eustis | F25B 7/00 |
| 9,938,896 B2* | 4/2018 | Bannari | F04B 41/02 |
| 10,746,480 B2* | 8/2020 | Eustis | F25B 30/06 |
| 2012/0067047 A1* | 3/2012 | Peterson | F28D 20/021 |
| | | | 60/651 |
| 2012/0319410 A1* | 12/2012 | Ambrosek | F02C 6/10 |
| | | | 290/1 R |
| 2013/0056169 A1 | 3/2013 | Stiesdal et al. | |
| 2014/0224295 A1 | 8/2014 | Yazawa et al. | |
| 2014/0366536 A1* | 12/2014 | Muren | F24S 60/00 |
| | | | 60/641.8 |
| 2015/0027122 A1* | 1/2015 | Brunhuber | F01K 7/22 |
| | | | 60/659 |
| 2015/0267612 A1* | 9/2015 | Bannari | F01D 15/10 |
| | | | 60/650 |
| 2015/0295508 A1* | 10/2015 | Conry | H02J 3/26 |
| | | | 363/37 |
| 2016/0024924 A1* | 1/2016 | Anthony | F02B 53/02 |
| | | | 60/531 |
| 2016/0370125 A1 | 12/2016 | Gilbert | |
| 2017/0227299 A1* | 8/2017 | Eustis | F25B 49/02 |
| 2019/0003384 A1* | 1/2019 | Bannari | F02C 6/16 |
| 2019/0293363 A1* | 9/2019 | Desgrosseilliers | F28D 20/0034 |
| 2020/0049424 A1* | 2/2020 | Suzuki | F28D 1/0426 |

FOREIGN PATENT DOCUMENTS

| | | |
|---|---|---|
| DE | 102100007626 A1 | 10/2012 |
| WO | 2012114113 A2 | 8/2012 |
| WO | 2012143226 A2 | 10/2012 |
| WO | 2016106726 A1 | 7/2016 |
| WO | 2016164341 A1 | 10/2016 |

OTHER PUBLICATIONS

Jin, Y., "Phase Change Materials (PCM) Based Multi-stage Thermal Energy Storage (TES) and Its Application", IHHH Conference on Energy Internet and Energy System Integration, Nov. 26, 2017, pp. 1-6.

Meibom, P., "Energy Comes Together in Denmark: The Key to a Future Fossil-Free Danish Power System", IEEE Power and Energy Magazine, Oct. 2013, vol. 11, No. 5, pp. 46-55.

* cited by examiner

METHOD AND SYSTEM FOR CONTROLLING ENERGY STREAMS

FIELD OF THE INVENTION

The invention relates to a method and to a system for controlling energy streams in order to connect operations of an electricity distribution network and a heat distribution network by means of an intermediate energy storage unit.

BACKGROUND OF THE INVENTION

In an electricity distribution network, the production and consumption of electricity must be kept constant at all times, so that the frequency and voltage of the electricity distribution network can be kept balanced. Balancing the production and consumption is made by means of automatic and operator-activated reserves. The reserves may be frequency containment reserves, frequency restoration reserves, or replacement reserves. The growth in production of renewable energy increases problems relating to operational reliability in the electricity distribution network, because the production of renewable energy may fluctuate greatly in time. Smaller renewable energy production units may also raise the number of disruptions to a significant degree, which easily leads to impaired quality of electricity.

In addition, it is known in the prior art to store electrical energy in various industrial applications and operating situations (such as voltage dips, reserve power) in order to raise operational and functional reliability of the network. Thermal energy may be stored for example as latent heat, i.e. absorbed heat. Storage units that are based on latent heat use energy released or absorbed in a phase transition process.

Heat distribution networks are used for heating buildings in communities and for various other heating requirements. The heat distribution network may be for example a district heating network. The heat is transferred by means of hot water circulating in the district heating network. District heating is often provided by combined heat and power production in power plants or separate heating centrals. Problems in district heating are caused by transmission losses in pipelines and due to insufficient heating power at maximum loads, whereby the required additional heating power must generally be produced by means of more expensive structures and fuels that pollute the environment to a greater degree.

The object of the invention is to remedy, or at least reduce the above-mentioned defects. Specifically, the object of the invention is to connect operations of an electricity distribution network and a heat distribution network and to optimize the resulting benefit. A further object of the invention is to disclose a method and a corresponding system that enable full utilization of renewable forms of production of electrical energy, such as wind power and solar power, in connection with electricity distribution networks and heat distribution networks, despite their high and difficult-to-predict, even instantaneous fluctuations in power.

SUMMARY OF THE INVENTION

The invention relates to a method for controlling energy streams in order to connect operations of an electricity distribution network and a heat distribution network by means of an intermediate energy storage unit. According to the invention, the power balance and quality of current and voltage of the electricity distribution network are adjusted by supplying the losses and surplus energies obtained by adjustment of the electricity distribution network to the energy storage unit in the form of heat, and from the energy storage unit the heat is extracted to the heat distribution network according to the heat requirement of the heat distribution network.

In one embodiment, the energy absorbing and storing material used in the energy storage unit is a substance having a phase transition temperature between the highest and the lowest operating temperatures of the energy storage unit. Thus, the storage capacity of the energy storage unit can be made relatively high in proportion to its size, as it is known that the phase transition process absorbs and releases considerably more energy than just a temperature rise or drop by a few degrees. In one embodiment, the phase transition used in the energy storage unit is from solid into liquid and back. This way the energy storage unit can be made simpler as its operations may be carried out at standard atmosphere. In one embodiment, the phase transition used in the energy storage unit takes place between water and ice. In one embodiment, the phase transition used in the energy storage unit is from liquid into vapour.

In one embodiment, it is advantageous that the energy storage unit is a salt storage unit where the temperature ranges are between 90-450° C. Thus, the most important selection criteria for the salt to be used are its price and the lowness of its phase transition temperature.

In one embodiment, it is advantageous that the energy storage unit is a water storage unit where the temperature ranges are −5-150° C. In one embodiment, the phase transition process is also applied in water storage units. In one embodiment, the phase transition used in the water storage unit is from solid into liquid and back, such as between ice and water. In one embodiment, the phase transition used in the water storage unit is from liquid into vapour, such as from water into water vapour. In one embodiment, the water storage unit is a layered water storage unit with cold liquid on the bottom and hot liquid on the top.

In one embodiment, the method according to the invention is intended to be used mainly in relatively short charging periods and discharging periods. Thus, the storage time for one charge of the energy storage unit is 1-120 h. In this case, the method according to the invention may be used for example for storing solar energy during the day and for using it during the night, for storing energy during windy hours and for using it when it is still, during other daily energy production peaks and consumption peaks and during heat distribution network failures and maintenance situations as a temporary heat source.

In one embodiment, the method according to the invention is used with longer charging periods and discharging periods. In this case, the storage time for one charge of the energy storage unit may be hours or days.

In the method according to the invention, the losses provided or surplus energies obtained by adjustment of the electricity distribution network are supplied directly to an electrical resistor inside the energy storage unit. It is also possible that the losses provided and energies obtained by the adjustment are supplied to a liquid tank from where the heat generated is transferred to the energy storage unit by means of a liquid circuit and suitable heat exchangers.

In addition, the invention relates to a system for controlling energy streams in order to connect operations of an electricity distribution network and a heat distribution network by means of an intermediate energy storage unit. According to the invention, the energy storage unit is a water storage unit or a mass storage unit applying a phase transition process for the storage of energy, the control system comprising adjustment means for maintaining optimal conditions of the electricity distribution network, supply means for supplying energy released by adjustment of the electricity distribution network to the energy storage unit, and a heat exchanger circuit between the energy storage unit and the heat distribution network with controls for supplying thermal energy to the heat distribution network in a controlled manner based on the heat requirement of the heat distribution network.

Preferably, the mass storage unit is a salt storage unit that absorbs heat as it warms up and melts down, and releases it as it cools down and solidifies. Particularly preferred salts to be used are sodium nitrate $NaNO_3$ or potassium nitrate $KNO_3$ or their suitable mixture. Although other salts may be used as well, the above-mentioned ones are well-suited because their melting temperatures are relatively low, approximately 307° C. for $NaNO_3$ and approximately 334° C. for $KNO_3$, whereby high temperatures in the energy storage units are avoided. Suitable mixtures of these salts may further have even lower melting temperatures. This also reduces heat losses from the storage units. Further, the purchase prices of said salts are relatively low, and they are non-toxic and only slightly detrimental to the environment. As most of the energy absorbs into the salts at the phase transition temperature, there is no need at all to use substantially higher temperatures than the phase transition temperature of the salt being used in the energy storage unit. Thus, the operating temperature range of the mass storage unit is preferably 90-450° C., i.e. the lowest temperature being in the heat distribution network temperature range and the highest temperature being slightly above the phase transition temperature of the salts used.

Preferably, the energy absorbing material to be stored in the water storage unit is water or a water containing composition that contains water by at least 50 vol-%, preferably more than 70 vol-%, more preferably more than 90 vol-%. In one embodiment, the absorbing material to be stored in the water storage unit is water, preferably substantially pure water.

The size, i.e. heat capacity of the energy storage unit used may be selected according to the requirements of the target application. There may be applications where the peak energy requirement is of the order of hours only, while on the other hand the system may also be used to satisfy an additional energy requirement of several days. Likewise, the system may be configured to take in even brief energy streams from solar cells or wind power plants or losses from network adjustment. Thus, the storage time or usage time of the energy storage use according to the invention may vary greatly in different embodiments, e.g. between 1-120 h, and may be even less.

In one embodiment of the invention, the supply means comprise a liquid tank provided with an electrical resistor in communication with the electricity distribution network, to which resistor the heat developed from surplus electricity is transferred. In addition, there is a liquid circuit provided with a pump for transferring the heat from the liquid tank to the energy storage unit.

In one embodiment of the invention, the energy storage unit is provided with a heat exchanger through which the liquid from the liquid tank circulates and transfers the heat to the energy storage unit.

In one embodiment, the heat exchanger circuit comprises a first heat exchanger in the energy storage unit and a second heat exchanger in the heat distribution network. This provides a closed liquid circuit that is not in direct communication with the material of the energy storage unit, e.g. water-based material or phase transition mass, nor with the liquid circulating in the heat distribution network, which is normally pressurized water at a temperature of approximately 120° C.

In one embodiment of the invention, the energy storage unit comprises only one heat exchanger connected to the supply means for supplying energy to the energy storage unit, as well as to the heat exchanger circuit for supplying thermal energy to the heat distribution network in a controlled manner. Thus, with appropriate valve control and using a suitable pump, the heat may be transferred between the liquid tank, the energy storage unit and the heat distribution network.

The heat distribution network used in the invention may be a district heating network supplying a city, a district of a city or a specific residential area.

However, the inventive idea is also applicable to smaller units, such as large properties or city blocks, e.g. supermarkets and shopping malls.

In one embodiment of the invention, the energy storage unit is distributed, i.e. at least two separate energy storage units are used in heat transfer communication with the same heat distribution network at a distance from each other. Thus, peak heat loads may be handled locally, even at the extremities of the heat distribution network. This reduces heat losses during peak loads and ensures heat distribution to different parts of the heating network in different types of failure situations.

In one embodiment of the invention, the energy storage unit is provided with at least one electrical resistor among the material of the energy storage unit for supplying electrical energy released by adjustment of the electricity distribution network to the energy storage unit directly. In one embodiment, in connection with the energy storage unit there is a heat exchanger circuit comprising at least one heat exchanger, through which liquid is circulated in order to transfer heat to the heat distribution network. In one embodiment, the heat exchanger circuit comprises a first heat exchanger in the energy storage unit and a second heat exchanger in the heat distribution network, and a liquid circuit between them. This provides a closed liquid circuit that is not in direct communication with the material of the energy storage unit, e.g. water-based material or phase transition mass, nor with the liquid circulating in the heat distribution network, which is normally pressurized water at a temperature of approximately 120° C. In one embodiment, the heat exchanger circuit comprises one heat exchanger in the heat distribution network, and the material of the energy storage unit, e.g. water, is circulated from the energy storage unit to said heat exchanger in order to transfer heat to the heat distribution network. Power supply to the electrical resistors is preferably implemented by means of power electronics.

In one embodiment of the invention, the energy storage unit is provided with an electrical resistor among the salt for supplying electrical energy released by adjustment of the electricity distribution network to the energy storage unit directly. While this may be the only method for melting the salt, preferably the electrical resistor is used as an alternative method only, for example in liquid circulation failure situations or during maintenance of the liquid circuit. Power supply to the electrical resistors is preferably implemented by means of power electronics.

It is also possible to use the energy storage unit as a heat load by charging it up to a certain heat level from the heat distribution network. Thus, for example during start-up of a cold energy storage unit, such as a water or salt storage unit, if there is surplus capacity in the heat distribution network, by extracting the heat from the heat distribution network, an energy stream directed upstream to the normal direction can be used for heating the water or salt first to approximately 120° C. before it is warmed up and melted down with energy obtained from the electricity network.

In one embodiment, in the energy storage unit, such as a salt or water storage unit, it is possible to form vapour by means of liquid circulation from water used as the liquid, and the resulting vapour may be utilized for a desired application. In one embodiment, the energy storage unit is provided with a water circuit using the heat of the energy storage unit to form vapour from the water, which vapour may be utilized for a desired application.

In one embodiment of the invention, the energy storage unit is a movable, detached unit. It may be a displaceable container, truck or trailer. Thus, it is displaceable and connectable to the heat distribution network near the energy consumption site. As a result, in different types of disruptions and maintenance situations, when part of the heat distribution network is disconnected from the rest of the network, it is possible to ensure disruption-free operation throughout the network, which is currently done by smoking and noisy diesel generators. In one embodiment, the control system according to the invention is provided in a displaceable container, e.g. a marine container or the like, to form an energy stream control unit. Thus, said control unit may be located near or in connection with the heat consumption site, e.g. in connection with a large property or a city block.

The invention is based on the idea that operations of the electricity distribution network and the heat distribution network are connected by means of an intermediate energy storage unit, such that the control over the electricity distribution network is improved, and the energy released by adjustment of the electricity distribution network may be stored and used in the heat distribution network as needed.

The system and the corresponding method according to the invention provide considerable advantages over the prior art. Thanks to the invention, it is possible to improve the control over the electricity distribution network. The invention allows the use of electrical power used by the storage unit for frequency control in the grid or the electricity distribution network. Also synthetic inertia may be provided by means of the invention in electricity distribution network failure situations. Further, reactive power may be compensated for, and quality of electricity locally improved. In the heat distribution network it is possible to reduce losses, as the heat may be produced near the consumption sites. The district heating network may be provided with reserve supplies that are adjustable, maintenance-free and movable due to their small size. The storage material is harmless to the environment. The storage unit may be freely located in the heat distribution network or near the heat consumption site. For example, the storage units may be distributed around district heating networks, such that the operational reliability of district heating is increased, and the storage units provide redundancy for plants producing heat for the district heating system. The storage units are freely adjustable when heat is discharged into the heat distribution network or the heat consumption site. The storage units may be configured to function as a group for example in the adjustment of the electricity network. Thus, several small storage units may be built into a larger unit for the market. A further benefit is provided by the stability and non-polluting nature of the features of the system. The energy storage capacity does not change but remains the same, irrespective of usage or the number of charging or discharging times.

LIST OF FIGURES

DETAILED DESCRIPTION OF THE INVENTION

The method and the system according to the invention will now be described in detail with reference to the accompanying drawings 1 and 2 representing schematic diagrams of some systems according to the invention.

Figure 1:
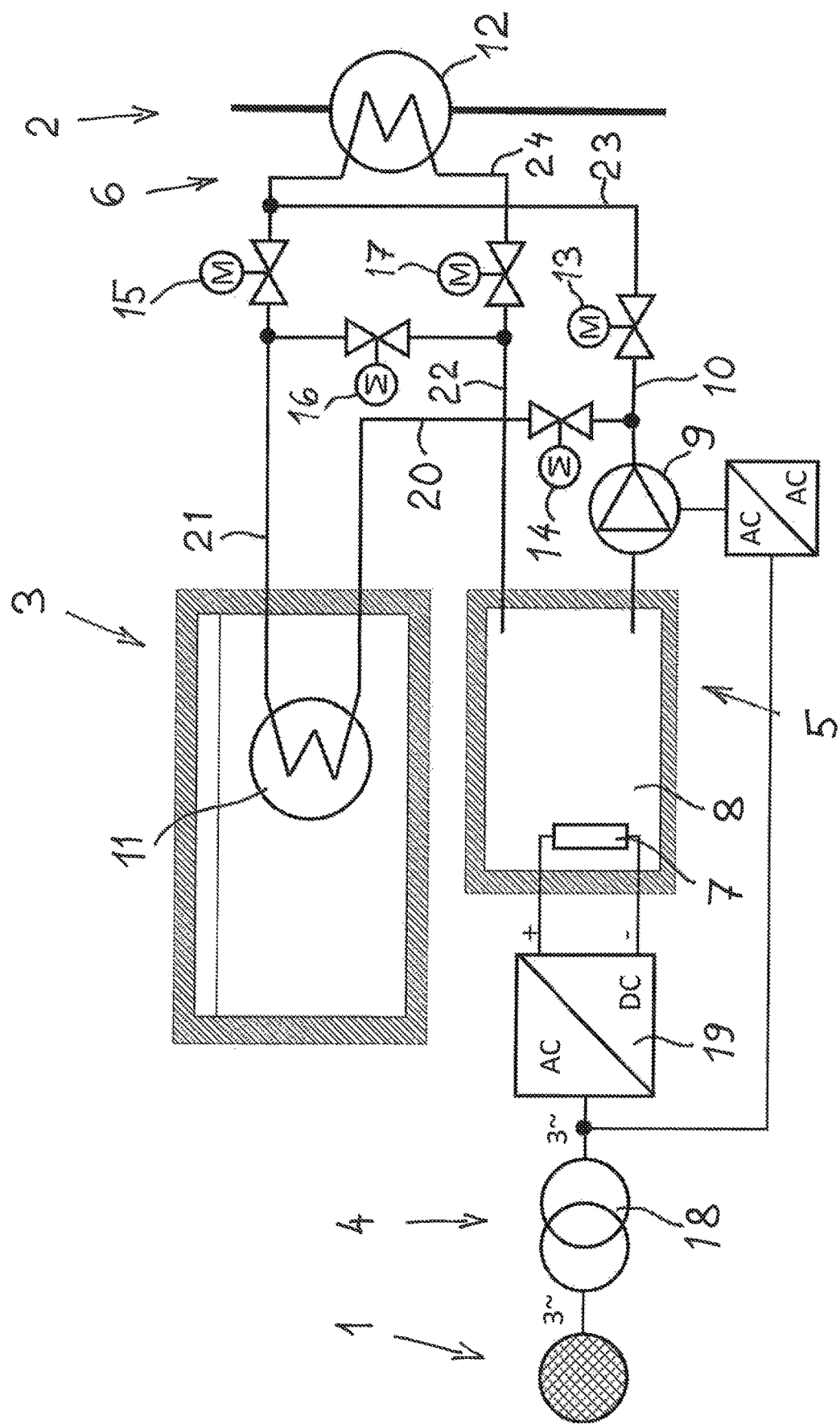
FIG. 1 represents one system for controlling energy according to the invention.

In one system for controlling energy according to the invention as shown in FIG. 1, between an electricity distribution network 1 and a heat distribution network 2 there is provided a mass storage unit serving as an energy storage unit 3, which in this embodiment is a salt storage unit. The salt is preferably sodium nitrate $NaNO_3$ or potassium nitrate $KNO_3$ or their mixture. Thus, the energy capacity of the heat storage unit can be increased, as it is possible to apply the phase transition of the salts between a solid and a liquid state, which is known to be greatly energy absorbing or releasing.

In the system according to the invention, adjustment and control of the electricity distribution network 1 is carried out by means of suitable adjustment means 4, including a transformer 18 and a rectifier 19, such that all surplus power is recovered. These operations performed in the network include at least power adjustment, i.e. use of surplus power, voltage adjustment, frequency adjustment, and reactive power adjustment or compensation. Supply means 5 provided in the system for supplying the power obtained to the energy storage unit 3 comprise a liquid tank 8 including an electrical resistor 7 to which the electrical power obtained by the adjustments is supplied. It is also possible to place another electrical resistor in the energy storage unit 3 directly, such that in certain situations, the energy obtained is supplied directly to the energy storage unit 3.

From the liquid tank 8 there is provided a liquid circuit 10, by means of which thermal energy from the liquid tank 8 may be transferred optionally to the energy storage unit 3 and/or to the heat distribution network 2. For the purpose of this heat transfer, the liquid circuit 10 comprises a first heat exchanger 11 in the energy storage unit 3, and a second heat exchanger 12 in communication with the heat distribution network 2. Further, the liquid circuit 10 is provided with a pump 9 arranged to pump liquid from the liquid tank 8 between the heat exchangers. The pump takes its operating energy between the transformer 18 and the rectifier 19.

From the pump 9, conduit 20 extends via valve 14 to the first heat exchanger 11 of the energy storage unit 3, from where conduit 21 goes to valve 16, via which through conduit 22 the liquid is able to return back from the energy storage unit 3 to the liquid tank 8. Thus, heat from the liquid tank 8 may be transferred to the energy storage unit 3. If energy is to be transferred directly to the heat distribution network 2 by the pump 9, valve 14 will be closed, such that conduit 10 would lead to valve 13, from where conduit 23 extends to the second heat exchanger 12 and further to conduit 24, which via valve 17 opens into conduit 22 and back to the liquid tank 8. Thus, the hot liquid from the liquid tank 8, the water of the like, transfers thermal energy directly to the heat distribution network 2.

When energy from the energy storage unit 3 is transferred to the heat distribution network 2, the liquid circuit is as follows. The liquid circulates from the pump 9 via valve 14 to conduit 20 and through heat exchanger 11 to conduit 21. From there, valve 16 closed and valve 15 opened, the circuit proceeds via conduit 23 to heat exchanger 12 in communication with the heat distribution network. From here the liquid returns via conduit 24, valve 17 and conduit 22 to the liquid tank 8.

Figure 2:
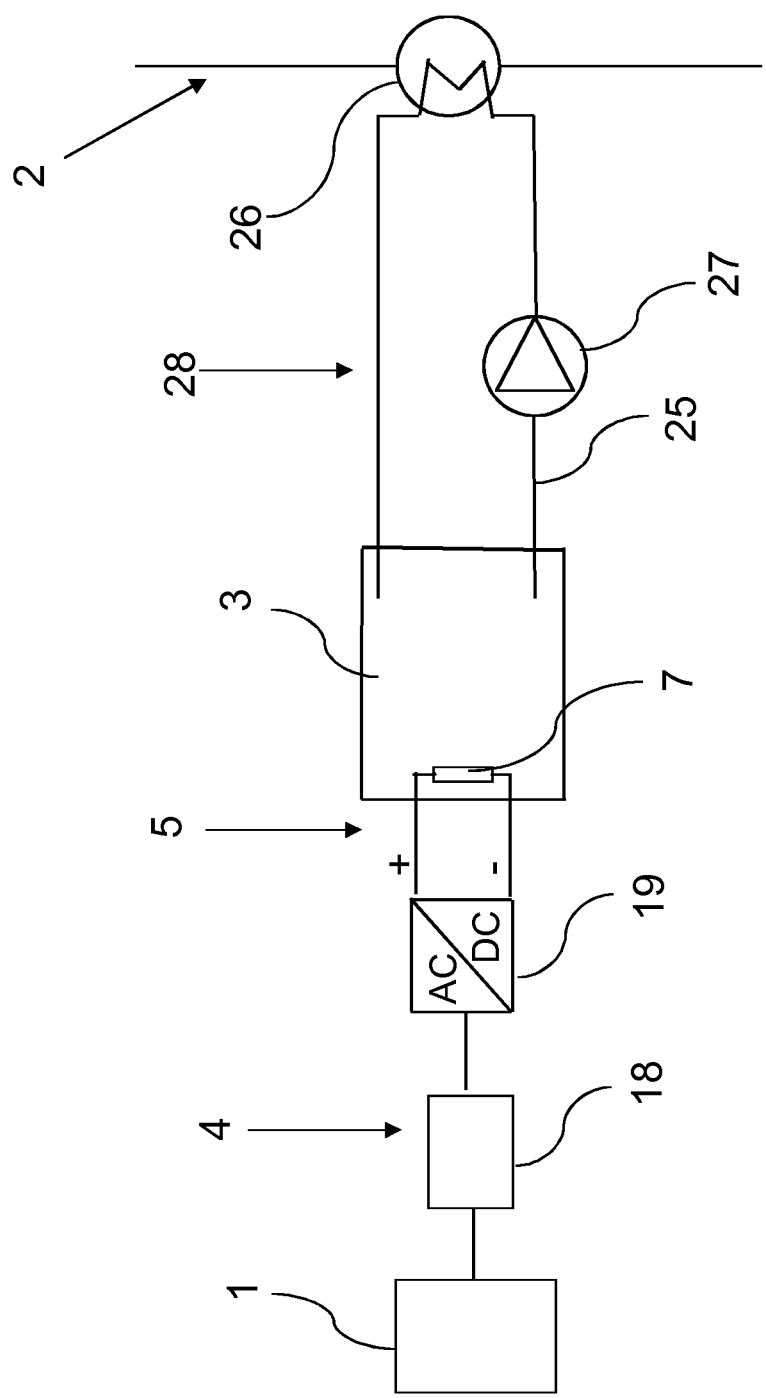
FIG. 2 represents another system for controlling energy according to the invention.

In one system for controlling energy according to the invention as shown in FIG. 2, between the electricity distribution network 1 and the heat distribution network 2 there is provided a water storage unit serving as the energy storage unit 3. The material of the water storage unit is water.

In the system according to the invention, adjustment and control of the electricity distribution network 1 is carried out by means of suitable adjustment means 4, including the transformer 18 and the rectifier 19, such that all surplus power is recovered. These operations performed in the network include at least power adjustment, i.e. use of surplus power, voltage adjustment, frequency adjustment, and reactive power adjustment or compensation. In the system, the energy storage unit 3 is provided with an electrical resistor 7 to which the electrical power obtained by the adjustments is supplied. The electrical resistor 7 functions as the supply means 5 for supplying energy released by the adjustment to the energy storage unit.

Between the energy storage unit 3 and the heat distribution network 2 there is provided a heat exchanger circuit 28 with controls for supplying thermal energy to the heat distribution network. From the energy storage unit 3 there is provided a liquid circuit 25 by means of which thermal energy from the energy storage unit 3 may be transferred to the heat distribution network 2. For the purpose of this heat transfer the liquid circuit 25 comprises a heat exchanger 26 in communication with the heat distribution network 2. Alternatively the heat exchanger circuit 28 may comprise a first heat exchanger in the energy storage unit 3 and a second heat exchanger in communication with the heat distribution network 2, and a closed liquid circuit between them. Further, the liquid circuit 25 of FIG. 2 is provided with a pump 27 arranged to pump liquid from the energy storage unit 3 to the heat exchanger 26 provided in the heat distribution network. The pump takes its operating energy between the transformer 18 and the rectifier 19. Thus, the water from the energy storage unit 3, or alternatively the liquid provided in the liquid circuit 25, transfers thermal energy to the heat distribution network 2 directly.

The invention has been described above by way of examples with reference to the accompanying drawings; however, various embodiments of the invention are possible within the scope defined by the claims.

The invention claimed is:

1. A method for controlling energy streams in order to connect operations of an electricity distribution network and a heat distribution network by means of an intermediate energy storage unit, and the energy storage unit comprises an electrical resistor as a supply means for supplying electrical energy released by adjustment of the electricity distribution network to the energy storage unit directly, and a heat exchanger circuit which comprises a first heat exchanger in the energy storage unit and a second heat exchanger in the heat distribution network for supplying thermal energy in a controlled manner from the energy storage unit to the distribution network, characterized in that the power balance and quality of current and voltage of the electricity distribution network are adjusted by supplying the losses provided by adjustment of the electricity distribution network to the energy storage unit in the form of heat, and from the energy storage unit, the heat is extracted to the heat distribution network according to the heat requirement of the heat distribution network.

2. The method according to claim 1, characterized in that the energy storing material used in the energy storage unit is a substance having a phase transition temperature between the highest and the lowest operating temperatures of the energy storage unit.

3. The method according to claim 2, characterized in that the phase transition used in the energy storage unit is from solid into liquid and back.

4. The method according to claim 1, characterized in that the energy storage unit is a salt storage unit in the temperature range of 90-450° C.

5. The method according to claim 1, characterized in that the energy storage unit is a water storage unit.

6. The method according to claim 1, characterized in that the losses provided by adjustment of the electricity distribution network are supplied directly to an electrical resistor inside the energy storage unit.

7. The method according to claim 1, characterized in that the losses provided by adjustment of the electricity distribution network are supplied to a liquid take from where the heat generated is transferred to the energy storage unit by means of a liquid circuit.

8. A system for controlling energy streams in order to connect operations of an electricity distribution network and a heat distribution network by means of an intermediate energy storage unit, characterized in that
the energy storage unit comprises an electrical resistor as a supply means for supplying electrical energy released by adjustment of the electricity distribution network to the energy storage unit directly, and a heat exchanger circuit comprises a first heat exchanger in the energy storage unit and a second heat exchanger in the heat distribution network for supplying thermal energy in a controlled manner from the energy storage unit to the distribution network,
the energy storage unit is a water storage unit or a mass storage unit applying a phase transition process for the storage of energy,
the control system comprises an adjustment means for maintaining optimal conditions of the electricity distribution network, and the supply means for supplying energy released by the adjustment to the energy storage unit, and
the heat exchanger circuit between the energy storage unit and the heat distribution network with controls for supplying thermal energy to the heat distribution network in a controlled manner.

9. The system according to claim 8, characterized in that the energy storage unit is a salt storage unit, and the salt is sodium nitrate $NaNO_3$ or potassium nitrate $KNO_3$ or their mixture.

10. The system according to claim 8, characterized in that the supply means comprise a liquid tank provided with an electrical resistor in communication with the electricity distribution network, and a liquid circuit provided with a pump between the liquid tank and the energy storage unit, and the energy storage unit is provided with the first heat exchanger through which the liquid from the liquid tank circulates and transfers the heat to the energy storage unit.

11. The system according to claim 10, characterized in that the pump is configured to circulate liquid in a controlled manner by means of valves between the liquid tank, the energy storage unit and the heat distribution network.

12. The system according to claim 8, characterized in that the heat distribution network is a district heating network.

13. The system according to claim 8, characterized in that power supplied to electrical resistors is implemented by means of power electronics, a frequency changer or an IGBT.

14. The system according to claim 8, characterized in that the energy storage unit is used as a heat load by charging it up to a certain heat level from the heat distribution network.

15. The system according to claim 8, characterized in that the energy storage unit is a movable, detached unit that is displaceable and connectable to the heat distribution network near the energy consumption site.

* * * * *